(12) United States Patent
Lambert et al.

(10) Patent No.: US 11,215,662 B2
(45) Date of Patent: Jan. 4, 2022

(54) METHOD, DEVICE AND SYSTEM TO PROTECT CIRCUITRY DURING A BURN-IN PROCESS

(71) Applicant: Intel Corporation, Santa Clara, CA (US)

(72) Inventors: William Lambert, Chandler, AZ (US); Kaladhar Radhakrishnan, Chandler, AZ (US); Michael Hill, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 679 days.

(21) Appl. No.: 16/020,425

(22) Filed: Jun. 27, 2018

(65) Prior Publication Data

US 2020/0003829 A1    Jan. 2, 2020

(51) Int. Cl.
*G01R 31/28* (2006.01)
*G05F 1/46* (2006.01)

(52) U.S. Cl.
CPC ....... *G01R 31/2879* (2013.01); *G01R 31/287* (2013.01); *G01R 31/2863* (2013.01); *G01R 31/2874* (2013.01); *G05F 1/465* (2013.01)

(58) Field of Classification Search
CPC ............ G01R 31/2839; G01R 31/2849; G01R 31/2851; G01R 31/2855; G01R 31/2856; G01R 31/2863; G01R 31/286; G01R 31/2879; G01R 31/287; G01R 31/2874; G01R 31/2884; G05F 1/465; G05F 1/462; H01L 24/72

See application file for complete search history.

(56) References Cited

U.S. PATENT DOCUMENTS

| | | | | |
|---|---|---|---|---|
| 7,288,951 | B1 * | 10/2007 | Bailey | G01R 31/2856 324/750.05 |
| 2003/0235929 | A1 * | 12/2003 | Cowles | G01R 31/2884 438/17 |
| 2013/0257525 | A1 * | 10/2013 | Kosonocky | H01L 23/49827 327/540 |

* cited by examiner

*Primary Examiner* — Alvaro E Fortich
*Assistant Examiner* — Dustin R Dickinson
(74) *Attorney, Agent, or Firm* — Essential Patents Group, LLP.

(57) ABSTRACT

Techniques and mechanisms for mitigating damage to voltage regulator (VR) circuitry of a packaged device. In an embodiment, the VR circuitry comprises a circuit leg between a first node and a second node. During a burn-in process, the VR circuitry provides a regulated output voltage to a load circuit via the first node, wherein the output voltage is based on a supply voltage received via the second node. While the VR circuitry provides the regulated output voltage to the load circuit, a supply current is provided to the load circuit via a path which is independent of any leg which is between the first node and the second node. In another embodiment, an integrated circuit (IC) chip of the packaged device comprises the load circuit, and the leg further comprises an off-chip coil structure which is distinct from the IC chip.

20 Claims, 8 Drawing Sheets

METHOD, DEVICE AND SYSTEM TO PROTECT CIRCUITRY DURING A BURN-IN PROCESS

BACKGROUND

1. Technical Field

Embodiments of the present invention relate generally to test equipment for integrated circuit diagnostics, and more particularly, but not exclusively, to the mitigation of circuit damage during a burn-in process.

2. Background Art

Many integrated circuit (IC) chips, including Central Processing Units (CPU's) and other processors are subjected to diagnostic tests and burn-in before they are put into regular use. The diagnostic and burn-in processes vary with different chips and different manufacturers. Burn-in may involve driving the chip at low clock speeds and elevated temperatures and voltages through a series of test sequences. For complex chips, burn-in can take an extended period of time—in some cases, many hours—before the chips are sufficiently tested and conditioned for commercial use.

Accurate and frequent measurement of the operating physical parameters of the IC's allows for more precise control of these parameters. For example, during burn-in testing, a very small increase in voltage or temperature can significantly reduce the time required to complete a burn-in cycle and therefore increase factory throughput. On the other hand, too high a voltage or temperature can destroy the IC. In addition, with semiconductor chips, as the temperature increases, the leakage current also increases, requiring increased current to be supplied while maintaining the same voltage. The increased current increases the temperature inducing a nonlinear feedback effect. Operation near the temperature and voltage limits therefore requires an increased precision in measurements of the chips' physical parameters and a faster response time. As the geometry of chip architectures grow smaller and smaller, the chips become more susceptible to component breakdown during burn-in operations.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments described herein variously provide techniques and mechanisms for mitigating damage to a voltage regulator of a packaged device, where the damage might otherwise result from a burn-in of the packaged device. A packaged device according to some embodiments includes a voltage regulator (VR) and a load circuit coupled thereto via a first node, wherein the VR is operable to provide a regulated output voltage to the load circuit based on a supply voltage being provided to the VR via a second node. In such an embodiment, the first node and the second node are coupled to one another via a circuit leg which includes an active circuit component of the VR, wherein the active circuit component is operable to selectively change a conductivity of the leg.

In some embodiments, the leg further comprises a coil structure (e.g., that of an inductor) which, for example, is distinct from—i.e., external to—but electrically coupled to an integrated circuit chip which comprises the load circuit. For example, the coil structure may be distinct from any integrated circuit (IC) chip of the packaged device. For brevity, such a coil structure is referred to herein as an "off-chip" coil structure. The IC chip may further comprise switch circuitry of the VR and control circuitry to operate said switch circuitry.

For example, such a packaged device accommodates connection to test equipment, such as automatic test equipment (ATE), which is operable to subject the load circuit and/or circuitry of the VR to a burn-in process. The burn-in process may include the test unit providing the supply voltage to the second node of the packaged device, wherein the coil structure is coupled between the second node and the first node. Furthermore, the burn-in process may include the test unit providing a supply current to the first node, which is between the coil structure and the load circuit. The supply current may be conducted between the test unit and the first node along a conductive path which is independent of (i.e., which excludes) the coil structure. For example, the conductive path may be independent of any off-chip coil structure of the VR (or, in an embodiment, any off-chip coil structure of the packaged device). In one embodiment, the conductive path is an interconnect structure which extends to each of the first node and a hardware interface contact at a side of the packaged device—e.g., wherein the interconnect structure omits any active circuit elements and omits any passive circuit elements.

In the particular context of a conductive path which omits a particular one or more off-chip coil structures (for example), such a conductive path is—for brevity—referred to herein as "bypassing" said one or more off-chip coil structures. In enabling a supply current to be provided to a VR output node via a conductive path which bypasses one or more off-chip coil structures of the VR, some embodiments facilitate a burn-in process which subjects integrated circuit structures to relatively rigorous conditions, but which mitigates the possibility of damage to at least one off-chip coil structure for which burn-in conditions can be less strenuous. Some embodiments additionally or alternatively mitigate damage to any of various other circuit structures, such as a die bump which, but for a bypass path for the supply current, might otherwise be exposed to a high current during burn-in.

Certain features of various embodiments are described herein in the context of techniques and circuit structures to mitigating burn-in damage to a switching voltage regulator. However, such description may be extended to additionally or alternatively apply to mitigating burn-in damage to any of various other types of voltage regulator (such as a linear voltage regulator). Moreover, certain features of various embodiments are described herein in the context of such a coil structure being that of an inductor. However, such description may be extended to additionally or alternatively apply to mitigating burn-in damage to any of various other circuit components which comprise a coil structure.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including circuitry operable to participate in a circuit burn-in process.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

It is pointed out that those elements of the figures having the same reference numbers (or names) as the elements of any other figure can operate or function in any manner similar to that described, but are not limited to such.

Figure 1A:
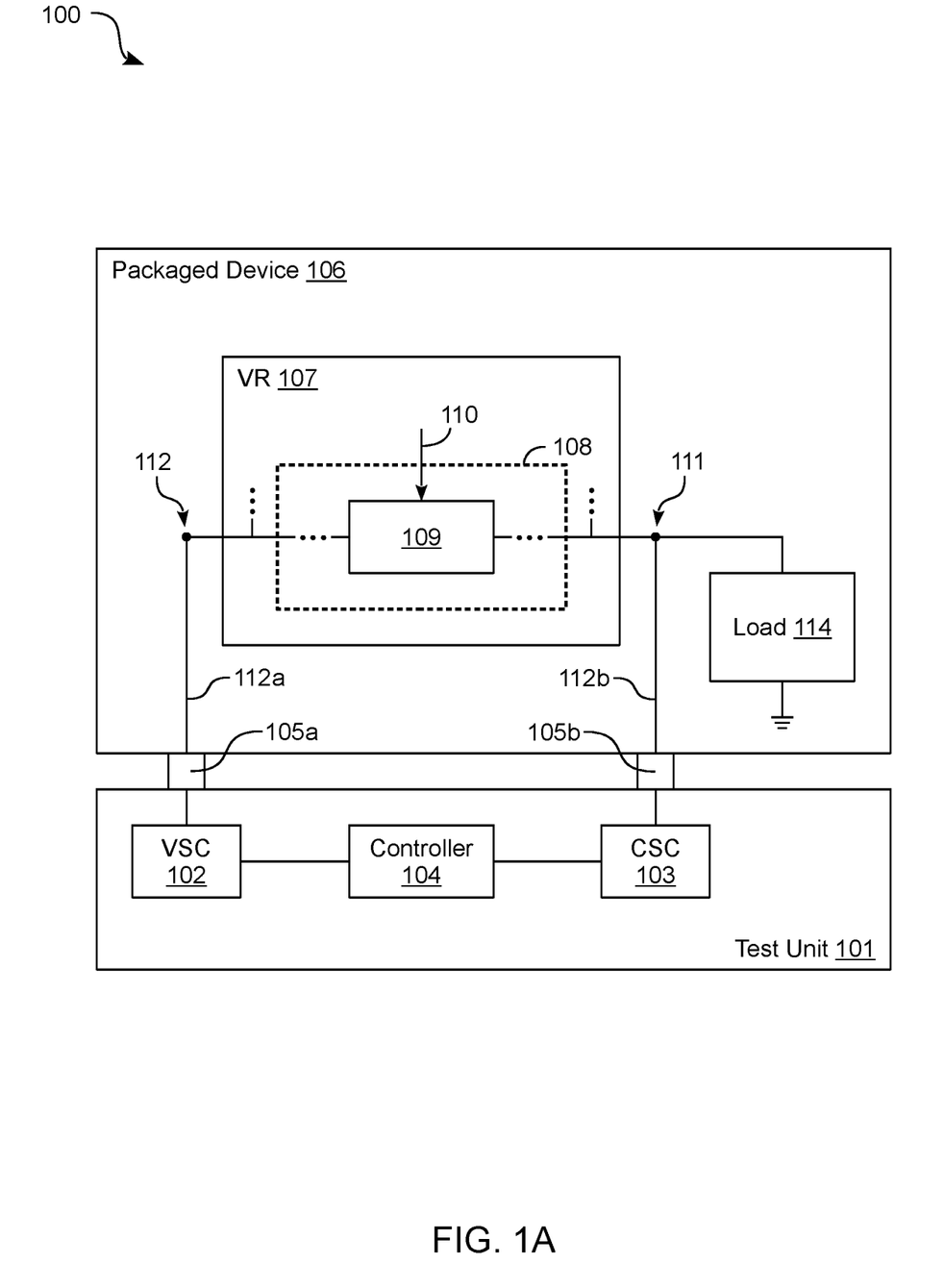
FIGS. 1A, 1B show functional block diagrams each of a respective system to perform burn-in of a packaged circuit device according to a corresponding embodiment.

FIG. 1A illustrates features of a system 100 to perform burn-in testing in accordance with an embodiment. System 100 is one example of an embodiment wherein circuit structures facilitate burn-in for one or more components of an IC chip of a device under test (DUT), wherein the circuit structures comprise a supply current path which bypasses a leg of a voltage regulator of the DUT. The leg may comprise at least one active circuit element which is operable to change a conductivity of the leg—e.g., by selectively disabling any current conduction or selectively allowing at least some current conduction. In some embodiments, the leg further comprises an inductor which is coupled to, and distinct from, the IC chip. System 100 is merely one example of a system in which the inventive subject matter is used or otherwise implemented.

As shown in FIG. 1A, system 100 comprises test equipment (such as the illustrative test unit 101 shown) and a packaged device 106 coupled thereto, the packaged device 106 to serve as a device under test (or "DUT") which is subject to a burn-in process using test unit 101. In some embodiments, system 100 omits packaged device 106 and merely comprises test unit 101. Other embodiments are provided solely with a device having features of packaged device 106. Test unit 101 may be that of any of a variety of computer devices such as a desktop computer, a server, a mobile device (e.g., including a laptop, a smart phone, a handheld reader, etc.) or the like. As described herein, test unit 101 may include connections each to provide to packaged device 106 a different respective one of a supply voltage or a supply current.

For example, packaged device 106 may comprise a voltage regulator (VR) 107 and a load circuit 114 coupled thereto, wherein packaged device 106 is to couple to test unit 101 via a hardware interface comprising conductive contacts 105a, 105b. When packaged device 106 is coupled to test unit 101, VR 107 may be coupled to receive a supply voltage via conductive contact 105a—e.g., the supply voltage provided by a voltage supply circuit VSC 102 of test unit 101. VR 107 may receive the supply voltage at a node 112 and, based on the supply voltage, generate a regulated voltage to load circuit 114 via a node 111.

In the example embodiment shown, VR 107 comprises a leg 108 coupled between nodes 111, 112, the leg 108 including one or more circuit components 109. In this context, the term "leg" (or "circuit leg") refers herein to a circuit path which extends between two nodes, wherein the circuit path comprises one or more circuit elements. The one or more circuit components 109 may include at least one active circuit component which is operable, responsive to a control signal 110, to selectively change a conductivity of leg 108. For example, such an active circuit component may comprise a transistor or other switch circuit element to facilitate linear voltage regulator functionality or switched regulator functionality.

Control signal 110 may be generated by other circuitry (not shown) which is included in or coupled to VR 107. For example, control signal 110 may include or be based on a feedback signal which such other circuitry provides based on a sampling of the regulated voltage at node 111. This type of feedback operation of VR 107 may be adapted, for example, from any of various conventional voltage regulation techniques (which are not detailed herein to avoid obscuring certain features of various embodiments). The one or more circuit components 109 may further comprise one or more passive elements including, for example, a coil structure such as that of an inductor.

When packaged device 106 is coupled to test unit 101, VR 107 may be further coupled to receive a supply current via conductive contact 105b—e.g., the supply current provided by a current supply circuit CSC 103 of test unit 101. The supply current may be provided to load circuit 114 via a path which is independent of (or "bypasses") leg 108. For example, performing a burn-in of packaged device 106 may include the supply voltage being provided to node 112 via conductive contact 105a and an interconnect 112a coupled therebetween. Such a burn-in further comprises the supply current being concurrently conducted between node 111 and conductive contact 105b via an interconnect 112b other than any interconnect of leg 108 and, for example, independent of any other leg coupled between nodes 111, 112). As a result, the supply current may bypass the one or more circuit components 109—e.g., thereby mitigating damage to said one or more circuit components 109 while load circuit 144 is subjected to relatively more stressful, high current conditions during a burn-in process.

Load circuit 114 may comprise circuitry of an integrated circuit (IC) chip which, for example, is coupled to (and distinct from) an inductor of leg 108. In such an embodiment, a path by which the supply current is conducted between conductive contact 105b and load circuit 114 may be independent of such an off-chip inductor—e.g., wherein the path bypasses any off-chip inductor of VR 107.

Figure 1B:
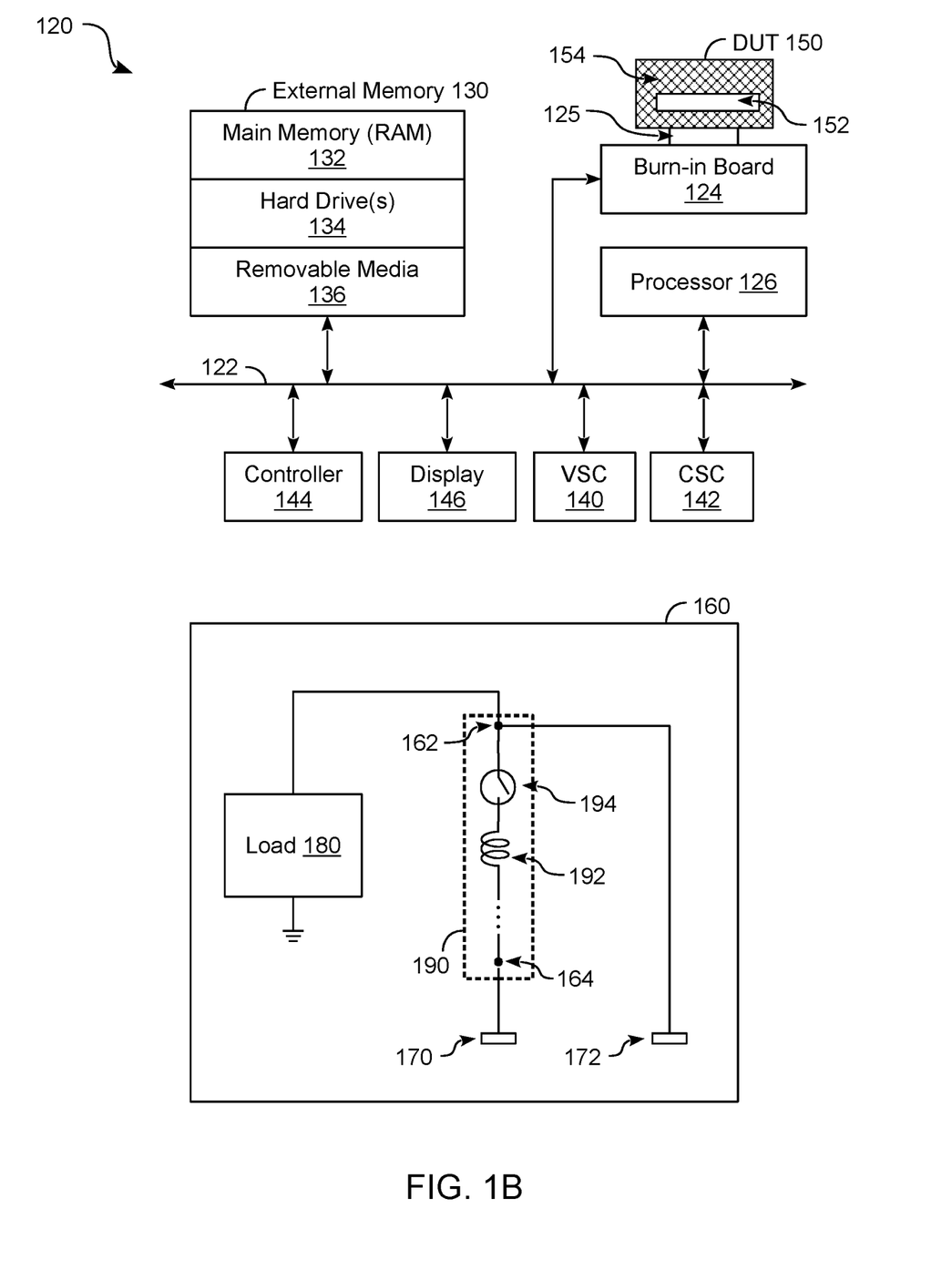

FIG. 1B illustrates a block diagram of a system 120 to perform component burn-in testing, in accordance with an embodiment. System 120 is one example of an embodiment wherein circuit structures provide functionality to burn-in one or more components of an IC chip of a device under test (DUT), wherein the circuit structures comprise a current path which bypasses a leg including an off-chip inductor of the DUT. For example, system 120 may include features of system 100.

As shown in FIG. 1B, system 120 comprises test equipment (also referred to herein as a test unit, or "TU") and a device under test (DUT) 150 coupled thereto, the DUT 150 to be subject to a burn-in process using the test equipment. In some embodiments, system 120 omits DUT 150 and comprises merely test equipment—such as that shown—to perform burn-in processes variously described herein. Other embodiments are provided solely with a device having features of DUT 150. The test equipment of system 120 may be that of any of a variety of computer devices such as a desktop computer, a server, a mobile device (e.g., including a laptop, a smart phone, a handheld reader, etc.) or the like. As described herein, such test equipment may include connections each to provide to DUT 150 a different respective one of a supply voltage or a supply current.

In an embodiment, the test equipment of system 120 includes a system bus 122 to electrically couple various component blocks of the test equipment. The system bus 122 may be a single bus or any combination of busses according to various embodiments. The test equipment of system 120 may comprise at least one processor 126. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, an application-specific integrated circuit (ASIC), an artificial intelligence circuit, neural network, or any other type of circuit for performing processing functions, or a combination of such computational circuits.

In an embodiment, the test equipment of system 120 also includes an external memory 130 that in turn may include one or more memory elements suitable to the particular application, such as a main memory 132 in the form of RAM, one or more hard drives 134, and/or one or more drives that handle removable media 136, such as diskettes, compact disks (CDs), digital variable disks (DVDs), flash memory drives, and other removable media known in the art. The external memory 130 may also be embedded memory such as the first die in a die stack, according to an embodiment. The test equipment of system 120 may also include a display device 146 and a keyboard and/or controller 144, which may include a mouse, trackball, voice-recognition device, or any other device that permits a system user to input information into and receive information from system 120.

Control logic of the test equipment—e.g., provided by processor 126—may be operable to control burn-in functions under the direction of computer instructions. The computer instructions may be stored on one or more computer-readable media within system 120, including any or all of the memory elements within external memory 130, and/or within memory elements such as high-speed cache (not shown) of processor 126.

The test equipment of system 120 may comprise a printed circuit board (such as the illustrative burn-in board 124 shown) which is to couple to DUT 150. In an embodiment, a hardware interface 125 of burn-in board 124 (e.g., the hardware interface 125 comprising any of a variety of sockets or other connector hardware) facilitates connectivity for the communication of one or more voltages, currents and/or signals with DUT 150. For example, the test equipment of system 120 may further comprise a voltage supply circuit VSC 140 and a circuit supply circuit (CSC) 142 to provide—respectively—a supply voltage and a supply current each to a different respective conductive contact of connector 125. As used herein, "conductive contact" refers to any of a variety of metal pins, pads, balls, bumps or other structures that facilitate electrical coupling. Burn-in board 124 is shown as being distinct from VSC 140, CSC 142, bus 122 and various other test equipment components. However, some or all such other components may be variously disposed in or on burn-in board 124, in other embodiments.

In the example embodiment shown, DUT 150 comprises a package material 154 and an IC chip 152 disposed therein. DUT 150 may further comprise an inductor which is distinct from (and electrically coupled to) IC chip 152—e.g., wherein the inductor is disposed in or on package material 154 or some other structure of DUT 150 such as a package substrate. VSC 140 may communicate a supply voltage, via connector 125, to a conductive path which comprises said inductor of DUT 150—e.g., wherein CSC 142 is coupled to communicate a supply current via connector 125 to another conductive path of DUT 150 which omits said inductor.

For example, an inset view 160 in FIG. 1B illustrates various circuit structures of DUT 150 according to one embodiment. As shown in view 160, DUT 150 may comprise a voltage regulator (VR) 190 and a load circuit 180 coupled thereto, wherein DUT 150 couples to connector 125 via conductive contacts 170, 172. A circuit leg of VR 190 may be coupled between (and, for example, extend to each of) nodes 162, 164. The leg may include one or more circuit elements, such as the illustrative switch circuitry 194 shown, which is operable to change a conductivity of the leg in response to a switch control signal (not shown). The leg may further comprise an off-chip inductor 192 (distinct from IC chip 152) which, for example, is surrounded by package material 154, coupled to IC chip 152 via one or more conductive contacts at a side of package material 154, disposed in a package substrate of DUT 150, or the like. When DUT 150 is coupled to connector 125, VR 190 may be coupled to receive a supply voltage via conductive contact 170—e.g., the supply voltage provided by VSC 140 to connector 125. VR 190 may receive the supply voltage at a node 164 and, based on the supply voltage, generate a regulated voltage to load circuit 180 via a node 162.

In some embodiments, VR 190 further comprises switch circuitry (now shown) which, for example, is coupled between inductor 192 and node 164. Such switch circuitry may be operable to selectively enable a conductive path between inductor 192 and node 164—e.g., to provide functionality which is adapted from any of various conventional boost converter architectures. In such an embodiment, IC chip 152 may comprise load circuit 180 and some or all switch circuitry of VR 190. Load circuit 180 may comprise one or more processors, memory resources, controllers, and/or other circuit logic which is operable based on a regulated voltage from VR 190. However, some embodiments are not limited to a particular functionality being provide by load circuit 180.

When DUT 150 is coupled to connector 125, node 162 may be further coupled to receive a supply current via conductive contact 172—e.g., the supply current provided by CSC 142 to connector 125. A conductive path between conductive contact 172 and node 162 may be independent of (i.e., may omit) any inductor of DUT 150 which is distinct from IC chip 152. For example, such a conductive path may be independent of inductor 192 and, in some embodiments, independent of any other inductor of VR 190. DUT 150 may thus participate in a burn-in process wherein a supply voltage and a supply current are concurrently provided via conductive contacts 170, 172 (respectively). By enabling an exchange of a supply current between node 162 and conductive contact 172 independent of inductor 192, some embodiments facilitate processing which is to burn-in some or all of load circuit 180 while mitigating the risk of damage to the off-chip inductor 192.

Figure 2:
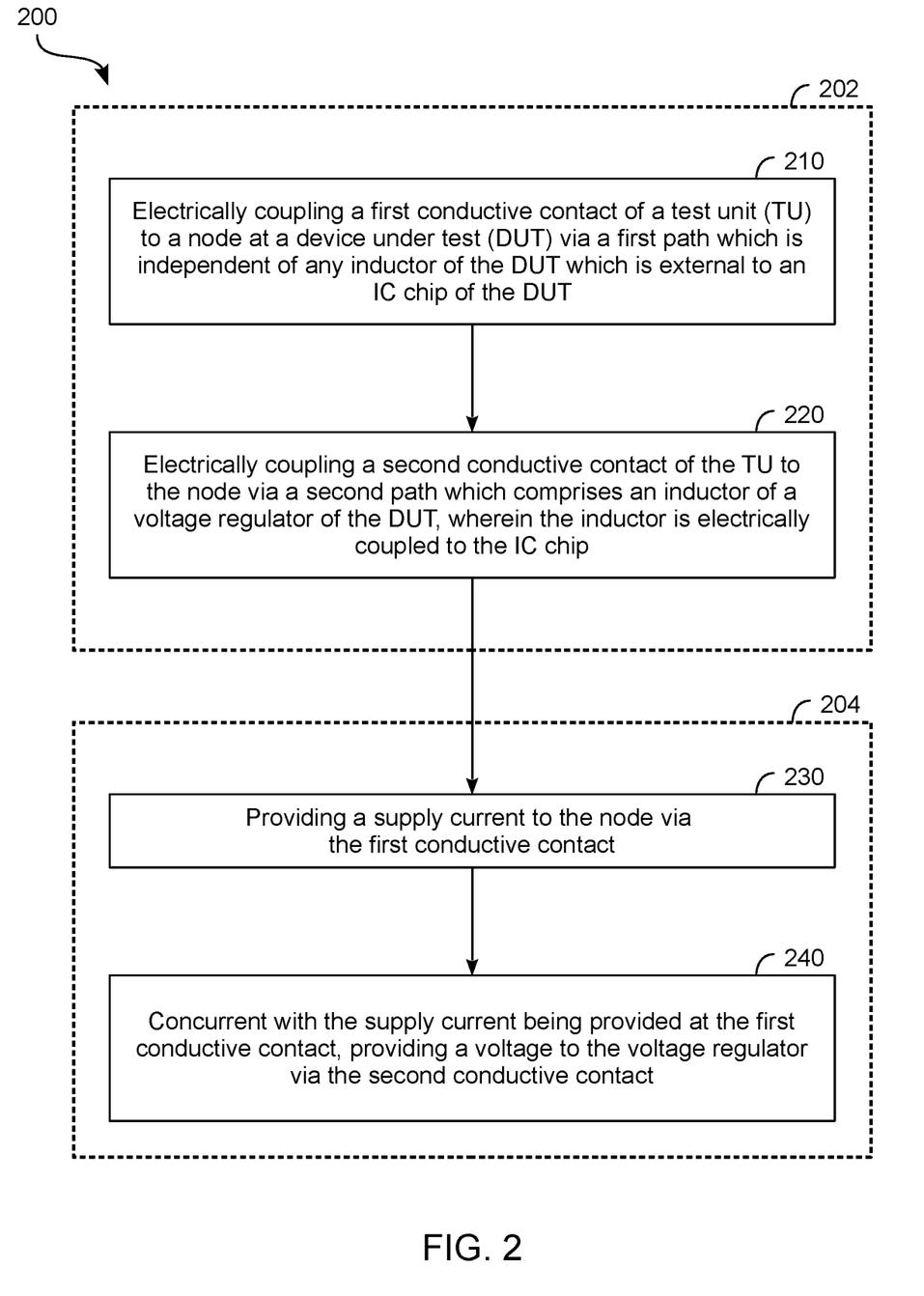
FIG. 2 is a flow diagram illustrating elements of a method to perform burn-in of a packaged circuit device according to an embodiment.

FIG. 2 shows features of a method 200 to perform a burn-in of a packaged device according to an embodiment. Method 200 is one example of an embodiment wherein a supply current is provided to an output node of a voltage regulator circuit via a path which bypasses one or more off-chip inductors of the voltage regulator circuit. Method 200 may be performed with system 100 or system 120, for example.

As shown in FIG. 2, method 200 includes operations 202 for coupling a test unit (TU) to a DUT which comprises a package material, an integrated circuit (IC) chip in the package material, and an off-chip inductor. The IC chip is electrically coupled to the inductor—e.g., wherein the IC chip comprises switch circuitry and wherein a voltage regulator of the DUT comprises the inductor and the switch circuitry. The voltage regulator is coupled to a load circuit via a node (e.g., node 162 of DUT 150). In one embodiment, the inductor comprises an air core inductor which, for example, is disposed in or on the package material or in or on a package substrate of the DUT.

In such an embodiment, operations 202 may comprise (at 210) electrically coupling a first conductive contact of the TU to the node via a first path which is independent of any off-chip inductor of the voltage regulator—e.g., independent of any inductor which is external to the IC chip. Operations 202 may further comprise (at 220) electrically coupling a second conductive contact of the TU to the node via a second path which comprises an inductor of a voltage regulator of the DUT, wherein the inductor is electrically coupled to the IC chip. Referring again to view 160, the first path may be provided by an interconnect coupling conductive contact 172 to node 162—e.g., wherein the second path is provided with inductor 192 and any other circuit structures coupled between nodes 162, 164.

In some embodiments, the DUT includes a ball grid array comprising both the first conductive contact and the second conductive contact. Alternatively, the DUT may include a ball grid array comprising the second conductive contact, wherein the first conductive contact is a conductive contact other than any conductive contact of a ball grid array. For example, the ball grid array may be at a first side of the DUT, wherein the first conductive contact is at a second side of the DUT (e.g., the second side orthogonal to the first side). Alternatively, the ball grid array and the first conductive contact may be each at the same side of the DUT.

Method 200 may additionally or alternatively comprise operations 204 for performing a burn-in of the DUT with the test unit coupled thereto. Such operations 202 comprise (at 230) providing a supply current to the node via the first conductive contact. In such an embodiment, operations 204 may further comprise (at 240) providing a voltage to the voltage regulator via the second conductive contact, wherein the providing at 240 is concurrent with providing the supply current at 230.

In some embodiments, operations 204 comprise performing the burn-in according to a predefined schedule. Such a schedule may specify one or more conditions (e.g., including an expiration of a time duration and/or a circuit temperature, a circuit voltage or other circuit state) for changing a characteristic of the supply current or a characteristic of the voltage. After performing the burn-in, method 200 may further perform additional operations (not shown) to collect performance data from the DUT. Based on such performance data, an evaluation may be made as to whether the load circuit satisfies one or more predefined test criteria. In such an embodiment, the burn-in schedule, the collecting of performance data and/or the evaluation thereof may be adapted, for example, from any of various conventional circuit burn-in techniques.

Figure 3:
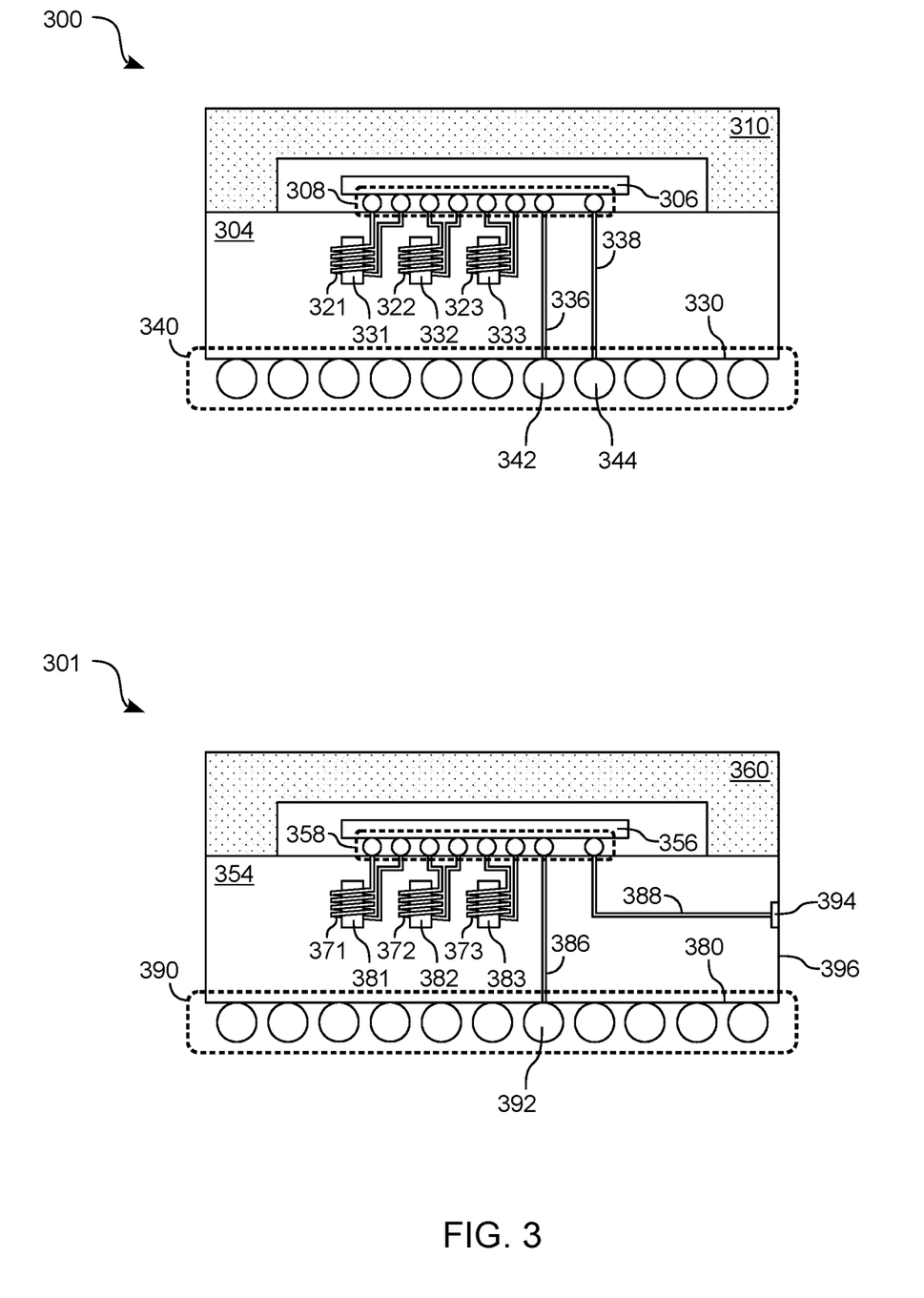
FIG. 3 is a cross-sectional side view diagram illustrating elements of a packaged circuit device according to an embodiment.

FIG. 3 shows cross-sectional side view diagrams of respective packaged devices 300, 301 each according to a corresponding embodiment. Packaged devices 300, 301 are merely two examples each of a respective DUT in which the inventive subject matter is used or otherwise implemented. One or each of packaged devices 300, 301 may include features of DUT 150 and/or may be used in a burn-in which is performed according to method 200, for example.

As shown in FIG. 3, packaged device 300 comprises a package substrate 304 and an IC chip 306 coupled thereto via conductive contacts 308 (such as those of a solder ball array, wire bond connections or the like). Substrate 304 may be formed of a pre-preg (pre-impregnated resin) material, a fiberglass reinforced epoxy material, such as FR-4, build-up layers, such as ABF (Ajinomoto Build-Up Film), or any other suitable material. Substrate 304 may be covered and/or IC chip 306 may be sealed within packaged device 300 with a packaging material 310 such as any of a variety of ceramic, curable resin (e.g., an epoxy) and/or other materials adapted, for example, from conventional device packaging techniques.

A top side of substrate 304 may comprise pads or lands to connect to IC chip 306 using conductive contacts 308. In one such embodiment, additional conductive contacts 340 (e.g., comprising solder balls, pins or the like) may be arranged—e.g., at a comparatively coarse pitch—on a bottom side of substrate 304 to facilitate coupling of packaged device 300 with connector 125 or other such interface hardware of a test unit. For example, conductive contacts 340 may be in the form of a land grid array (LGA), a surface mount array, or any of various other types of connector pads, lands, or solder balls—e.g., for connection to a socket or directly to a circuit board such as a motherboard, daughter card, logic board or other type of system board.

Additional IC chips (not shown) may be attached to the top side of substrate 304. IC chip 306 and/or any such additional IC chips may contain memory, a specialized processor, passive devices or other components. They may be attached to lands or pads on substrate 304 and secured and sealed with an underfill or in any other way, depending on the intended use of packaged device 300. There may be many other IC chips of different types and sizes on the top side and on the bottom side of substrate 304. There may also be other IC chips stacked over IC chip 306. While IC chip 306 is described in the context of a central processing unit (CPU), other types of IC chips may be used including SoC (System on a Chip) dies. Similarly, packaged device 300 may be for a specialized purpose or for multiple purposes such as a SiP (System in a Package).

The techniques described herein are particularly well suited for one or more off-chip inductors of a voltage regulator (VR) but may be applied to one or more other embedded coils for different applications. The one or more coils may be part of an inductor, transformer, or other passive device. There may also be one or more embedded coils for different functions with the same or different burn-in techniques applied. In an embodiment, load circuitry of IC chip 306, typically but not necessarily comprising a multiple core processor, may be coupled to one or more voltage regulators which (for example) include switch circuitry also formed on IC chip 306. Accordingly, some circuitry of one or more VRs may be very near the load circuitry for which the one or more VRs supply regulated voltage. The one or more VRs may each comprise a respective inductor that is not integrated on IC chip 306—e.g., where each such inductor is instead in or on substrate 304, in or on package material 310, or the like. The greater space available off of IC chip 306 allows for a larger higher quality inductor to be fabricated at lower overall cost than if the inductor were formed on IC chip 306.

In the illustrated example, packaged device 300 includes an inductor 321 comprising a coil structure which, for example, winds around a core structure 331 in package substrate 304. Inductor 321 may be a magnetic core inductor, wherein core structure 331 comprises a ferromagnetic material. Alternatively, inductor 321 may be an air core inductor (or "ACI") wherein core structure 331 omits any such ferromagnetic material. A VR of packaged device 300 may comprise inductor 321—e.g., wherein a load circuit of IC chip 306 is to receive a regulated voltage from the VR.

In one such embodiment, a burn-in process—such as one according to method 200—comprises packaged device 300 receiving a supply voltage and a supply current via different respective conductive contacts of a hardware interface. For example, a hardware interface of packaged device 300 may comprise conductive contacts 340 to couple to a test unit (not shown)—e.g., where conductive contacts 342, 344 of conductive contacts 340 are to receive from the test unit a supply voltage and a supply current, respectively. Conductive contacts 342, 344 may functionally correspond (respectively) to conductive contacts 170, 172, for example.

In one such embodiment, an interconnect 336 of packaged device 300 communicates the supply voltage between conductive contact 342 and a first node of IC chip 306—e.g., where another interconnect 338 of packaged device 300 communicates the supply current between conductive contact 344 and a second node of IC chip 306. Inductor 321 may be coupled between the first node and the second node— e.g., where switch circuitry of IC chip 306 is further coupled to selectively provide a conductive path between inductor 321 and the first node. Based on the supply voltage, the VR may provide a regulated voltage at the second node—e.g., where, during a burn-in process, the supply current is concurrently provided at the second node with interconnect 338. Accordingly, the supply current may bypass inductor 321 during said burn-in process, thereby mitigating a risk of damage to inductor 321.

Although some embodiments are not limited in this regard, packaged device 300 may further comprise one or more other inductors. For example, a coil structure of another inductor 322 may wind around a core structure 332—e.g., where a coil structure of still another third inductor 323 similarly winds around a core structure 333. In one such embodiment, the VR which comprises inductor 321 (or, alternatively, other VR circuitry of packaged device 300) comprises one or both of inductors 322, 323.

In the example embodiment illustrated by packaged device 300, conductive contacts 342, 344 are each at the same side 330 of packaged device 300—e.g., wherein a ball grid array comprises conductive contacts 340. In various other embodiments, a packaged device may couple to a voltage supply source and a current supply source via conductive contacts which are at different respective sides of said packaged device. By way of illustration and not limitation, packaged device 301 comprises a package substrate 354, an IC chip 356, and packaging material 360 which, for example, functionally correspond to package substrate 304, IC chip 306, and packaging material 310 (respectively). Conductive contacts 358 and conductive contacts 390—e.g., at opposite respective sides of package substrate 354—may functionally correspond to conductive contacts 308 and conductive contacts 340 (respectively).

In one such embodiment, packaged device 301 includes an inductor 371 comprising a coil structure which, for example, winds around a core structure 381. A VR of packaged device 301 may comprise inductor 371—e.g., wherein a load circuit of IC chip 356 is to receive a regulated voltage from the VR. A burn-in process—such as one according to method 200—may comprise packaged device 301 receiving a supply voltage and a supply current via respective conductive contacts 392, 394 which are for coupling packaged device 301 to a test unit (not shown).

An interconnect 386 of packaged device 301 may communicate the supply voltage between conductive contact 392 and a first node of IC chip 356—e.g., where another interconnect 388 of packaged device 301 communicates the supply current between conductive contact 394 and a second node of IC chip 356. Inductor 371 may be coupled between the first node and the second node—e.g., where switch circuitry of IC chip 356 selectively provides a conductive path between inductor 371 and the first node. Based on the supply voltage, the VR may provide a regulated voltage at the second node—e.g., where, during a burn-in process, the supply current is concurrently provided at the second node with interconnect 388. Accordingly, the supply current may bypass inductor 371 during said burn-in process, thereby mitigating a risk of damage to inductor 371.

As shown in FIG. 3, conductive contacts 392, 396 may be at different respective sides 380, 396 of packaged device 301—e.g., wherein sides 380, 396 are orthogonal to one another. For example, a ball grid array of packaged device 300 may comprise conductive contacts 390 (which, in turn, include conductive contact 392), wherein the conductive contact 394 is a conductive contact other than any conductive contact of said ball grid array.

Although some embodiments are not limited in this regard, packaged device 301 may further comprise one or more other inductors. For example, a coil structure of another inductor 372 may wind around a core structure 382 in package substrate 354—e.g., where a coil structure of still another third inductor 373 similarly winds around a core structure 383. In one such embodiment, the VR which comprises inductor 371 (or, alternatively, other VR circuitry of packaged device 301) comprises one or both of inductors 372, 373.

Figure 4:
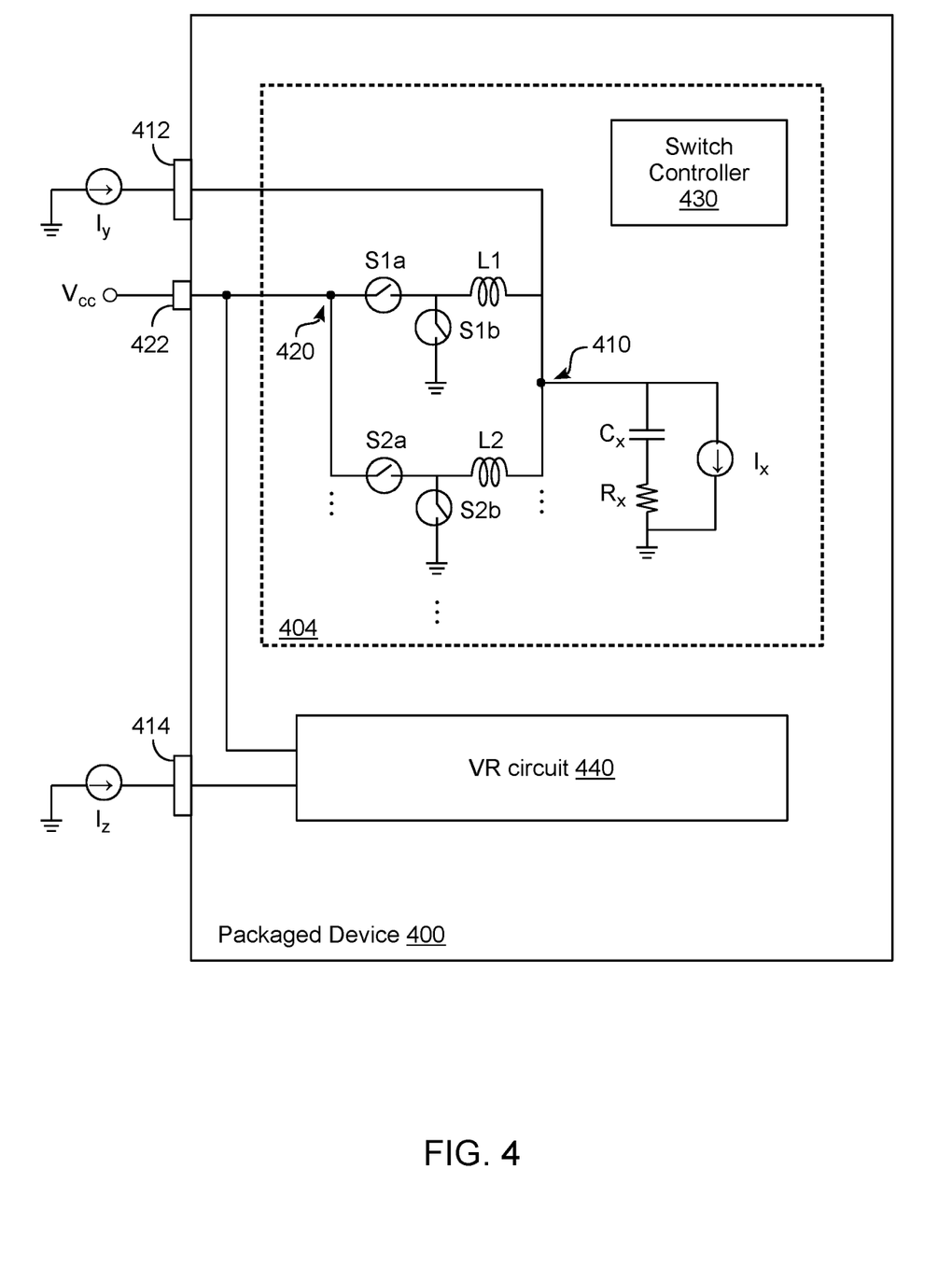
FIG. 4 is a circuit diagram illustrating elements of a packaged circuit device according to an embodiment.

FIG. 4 shows features of a packaged device 400 to participate in a burn-in process according to an embodiment. Packaged device 400 is one example of an embodiment wherein multiple off-chip inductors are variously bypassed each by a respective conductive path, where each such conductive path is to provide a supply current at a respective node between a VR circuit and a corresponding load circuit. Packaged device 400 may include features of DUT 150 or one of packaged devices 300, 301, for example. Alternatively or in addition, a burn-in of packaged device 400 may include operations of method 200.

As shown in FIG. 4, packaged device 400 includes a voltage regulator circuit 404 comprising an inductor L1 which, for example, corresponds functionally to inductor 192. Inductor L1 may be coupled to, but distinct from, an IC chip of packaged device 400—e.g., wherein the IC chip comprises a load circuit (not shown) which is to receive a regulated voltage from VR circuit 404. Such an IC chip may further comprise one or more switches and/or other circuitry of VR circuit 404. In the embodiment shown, VR circuit 404 comprises conductive contacts 412, 422 to receive, respectively, a supply voltage $V_{cc}$ and a supply current $I_y$ each from a test unit (not shown) which is to couple to, and perform a burn-in of, packaged device 400. Supply voltage $V_{cc}$ may be provided to a node 420, wherein VR circuit 404 is to output a regulated supply voltage, based on supply voltage $V_{cc}$, to a load circuit (not shown) via another node 410.

For example, a switch S1a of VR circuit 404 may be coupled between inductor L1 and node 420—e.g., wherein another switch S1b is coupled between inductor L1 and a ground voltage or other such reference potential. Switches S1a, S1b may be variously operated by control circuitry (such as the illustrative switch controller 430 shown) to selectively provide respective conductive paths to inductor L1. In combination with other components of VR circuit 404 (such as the illustrative capacitor $C_x$, resistor $R_x$, and current source circuit $I_x$ shown) such operation of switches S1a, S1b may facilitate boost converter, buck converter or other functionality whereby VR circuit 404 regulates an output voltage at node 410. In such an embodiment, the IC chip coupled to inductor L1 may include some or all of the load circuit, switches S1a, S1b, capacitor $C_x$, resistor $R_x$, current source circuit $I_x$ and switch controller 430.

During a burn-in of packaged device 400, supply current $I_y$ may be provided—concurrently with supply voltage $V_{cc}$ being provided—via an interconnect which extends to each of conductive contact 412 and node 410. Accordingly, supply current $I_y$ may bypass inductor L1 while other circuitry of VR circuit 404 (and/or circuitry of the load circuit) is being subjected to burn-in processes.

In some embodiments, one or more additional off-chip inductors may be bypassed during a burn-in of packaged device 400. For example, supply current $I_y$ may also bypass another inductor of VR circuit 404 and/or another supply current may bypass an inductor of another VR circuit which receives supply voltage $V_{cc}$. By way of illustration and not limitation, VR circuit 404 may further comprise an additional inductor L2 and switches S2a, S2b—e.g., wherein switch S2a is coupled between inductor L2 and node 420, and wherein switch S2b is coupled between inductor L2 and a reference potential. Switches S2a, S2b may be variously operated with switch controller 430 (or other such circuit logic) to provide additional boost converter, buck converter or other functionality for regulating, based on supply voltage $V_{cc}$, the output voltage at node 410. In such an embodiment, communication of supply current $I_y$ between conductive contact 412 and node 410 during a burn-in may bypass (and mitigate damage to) both of inductors L1, L2.

Alternatively or in addition, packaged device 400 may further comprise another VR circuit 440 which—like VR circuit 404—includes some or all of the circuit features shown in inset view 160 of FIG. 1B. VR circuit 440 may be another instance of VR circuit 404, for example. VR circuit 440 may also be coupled to receive supply voltage $V_{cc}$ via node 420—e.g., wherein VR circuit 440 is further coupled to receive, via a conductive contact 414, a supply current $I_z$ from the test unit. In such an embodiment, VR circuit 440 may provide a second regulated voltage to a second load circuit (not shown) of the IC chip which is coupled to inductor L1. Similar to VR 404, VR circuit 440 may comprise a second inductor (not shown) which is electrically coupled to the IC chip. VR 440 may be coupled to said second load circuit via a respective output node. An interconnect may couple conductive contact 414 to said output node independent of said second inductor—e.g., independent of any inductor of VR 440 which is external to the IC chip. In such an embodiment, communication of supply current $I_z$ between conductive contact 414 and the output node during the burn-in may bypass (and mitigate damage to) the second inductor of VR circuit 440.

Figure 5:
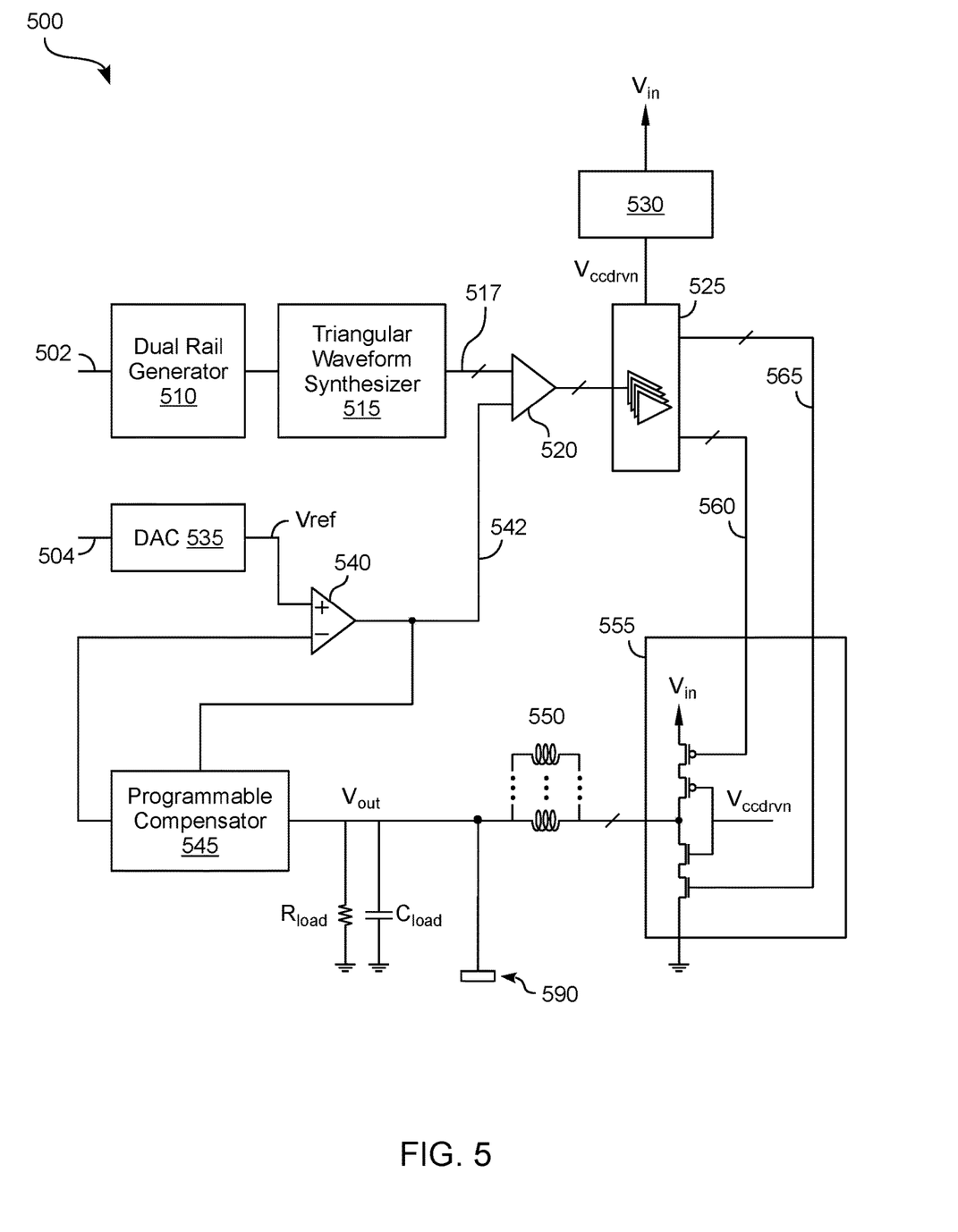
FIG. 5 is a cross-sectional side view diagram illustrating elements of a packaged circuit device according to an embodiment.

FIG. 5 shows features of a voltage regulator (VR) 500 to participate in a circuit burn-in process according to an embodiment. VR 500 may include features of one of VR 190 or VR 404—e.g., wherein some or all of method 200 is performed with VR 500. In one example embodiment, VR 500 supports functionality of a 140 MHz synchronous multiphase buck converter with multiple (e.g., sixteen) phases.

As shown in FIG. 5, one or more buck regulator bridges of VR 500 may be formed each by replacing power gates, from any of various previous designs, with a respective cascode arrangement 555—e.g., where each such cascode arrangement 555 comprises respective NMOS power switches and PMOS power switches. A given cascode arrangement 555 may comprise power switches which are implemented with logic devices from more advanced (e.g., smaller feature size) semiconductor processes, and at the same time, they may be able to handle reasonably high input voltages (e.g., up to 1.8 VDC). This may reduce the cost of extra processing steps for high voltage devices, while achieving desired switching characteristics.

Bridge drivers 525 of VR 500 may each provide to a corresponding cascode arrangement 555 a respective PMOS driver signal 560 and a respective NMOS driver signal 565. Such bridge drivers 525 may be variously controlled with high-voltage level-shifters and, for example, may support ZVS (zero-voltage switching) and/or ZCS (zero-current-switching) soft-switching operation. In one embodiment, respective gates of power switches in a given cascode arrangement 555 are variously operated based on a "half-rail" supply 530. A voltage $V_{ccdrvn}$ provided by supply 530 may, for example, be regulated to one half of an input voltage Vin provided to cascode arrangement 555. This voltage $V_{ccdrvn}$ may be used as a low-side supply for a PMOS bridge driver as well as for the high-side supply of an NMOS bridge driver. The area occupied by the power switches and drivers may be small, so they may be efficiently distributed across the die, for example, above a connection to their associated package inductor, which minimizes routing losses. The driver circuitry may be interleaved with the power switches in an array which may mitigate parasitics to allow for very high switching frequencies. This also may allow the size of the bridge to be scaled based on the current requirements and optimization points for each supply domain.

In the depicted embodiment, a given VR domain may be operated by control logic (not shown) to generate a pulse width modulated signal. For example, VR 500 may provide functionality of a fixed comparator pulse width modulator (PWM) using a dual rail generator 510. The dual rail generator 510 may receive from the control logic an input signal 502 which, for example, indicates current respective voltage levels VH and VL of an adjustable high rail and an adjustable low rail. Based on input signal 502, dual rail generator 510 may provide rail levels VH and VL to a triangular waveform generator 515, which in turn generates a triangular waveform 517 that cycles between the current rail levels VH and VL. Triangular waveform 517 may be provided as an input to a comparator 520.

Comparator 520 may also receive another signal 542 which is generated based on a reference voltage Vref. For example, a high-precision digital-to-analog converter DAC 535 of VR 500 may generate Vref for use by a programmable, high bandwidth analog fully differential compensator (the functionality of which is provided with an amplifier 540 and a programmable compensator circuit 545). Generation of Vref by DAC 535 may be based on a signal 504, from the control logic, which specifies a voltage level for Vref. Based on Vref and another input from programmable comparator circuit 545, amplifier 540 may provide a feedback voltage 542 to comparator 520. In one embodiment, feedback voltage 542 is also provided along a feedback path to programmable comparator circuit 545.

Comparator 520 may subsequently output to some or all of bridge drivers 525 a pulse width modulated signal which is based on a difference between triangle wave signal 517 and feedback voltage 542. Rail levels VH and VL and reference voltage Vref may thus be used to control the duty cycle of a bit stream represented by the pulse width modulated signal. The PWM frequency, PWM gain, phase activation, and the angle of each phase may be programmable in fine increments to enable optimal efficiency and minimum voltage ripple across a span of different operating points. In addition, spread-spectrum may be used for EMI and RFI (Radio Frequency Interference) control.

Compensator functionality may be provided with amplifier 540 and programmable compensator circuit 545 at least insofar as they are coupled to facilitate a closed voltage regulation loop for stabilizing an output voltage Vout. For example, one or more inductors may be coupled between a given cascode arrangement 555 and a node which is to provide a corresponding output voltage Vout to a load circuit (not shown). Such one or more inductors may include the illustrative inductors 550 which, in an embodiment, are arranged in an in-parallel configuration. One or more additional circuit elements—e.g., including the illustrative resistor $R_{load}$ and capacitor $C_{load}$ shown—may be coupled to the node to facilitate regulation of Vout. A given programmable compensator 545 may be programmed for its respective voltage domain based on a corresponding output filter, and may be reprogrammed while the domain is active to maintain an efficient transient response, e.g., as phase shedding occurs.

Some or all of the one or more inductors 550 may correspond functionally to one of inductors 192, L1 or L2—e.g., wherein a respective cascode arrangement 555 corresponds functionally to switches S1$a$, S1$b$ (or alternatively, to switches S2$a$, S2$b$). For example, some or all of the one or more inductors 550 may be external to an IC chip which comprises some or all other components of VR 500. In one such embodiment, the node by which VR 500 provides output voltage Vout is further coupled to a conductive contact 590 by which VR 500 receives a supply current from a test unit (not shown). The path which couples conductive contact 590 to said node may omit one or more inductors 550—e.g., wherein the signal path is independent of any off-chip inductor.

Figure 6:
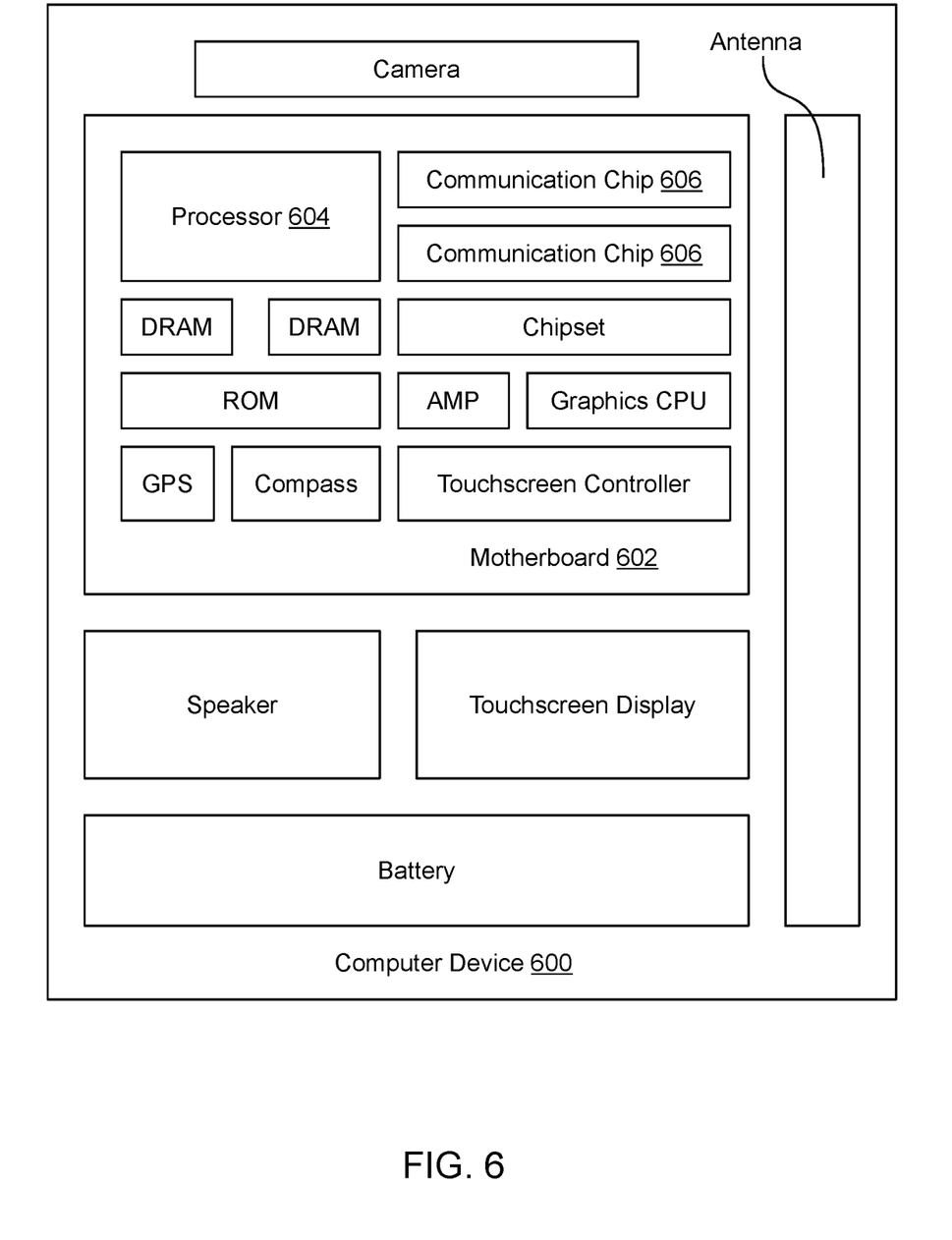
FIG. 6 is a functional block diagram illustrating a computing device in accordance with one embodiment.

FIG. 6 illustrates a computing device 600 in accordance with one embodiment. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The term "processor" may refer to any device or portion of a device that processes electronic data from registers and/or memory to transform that electronic data into other electronic data that may be stored in registers and/or memory. The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
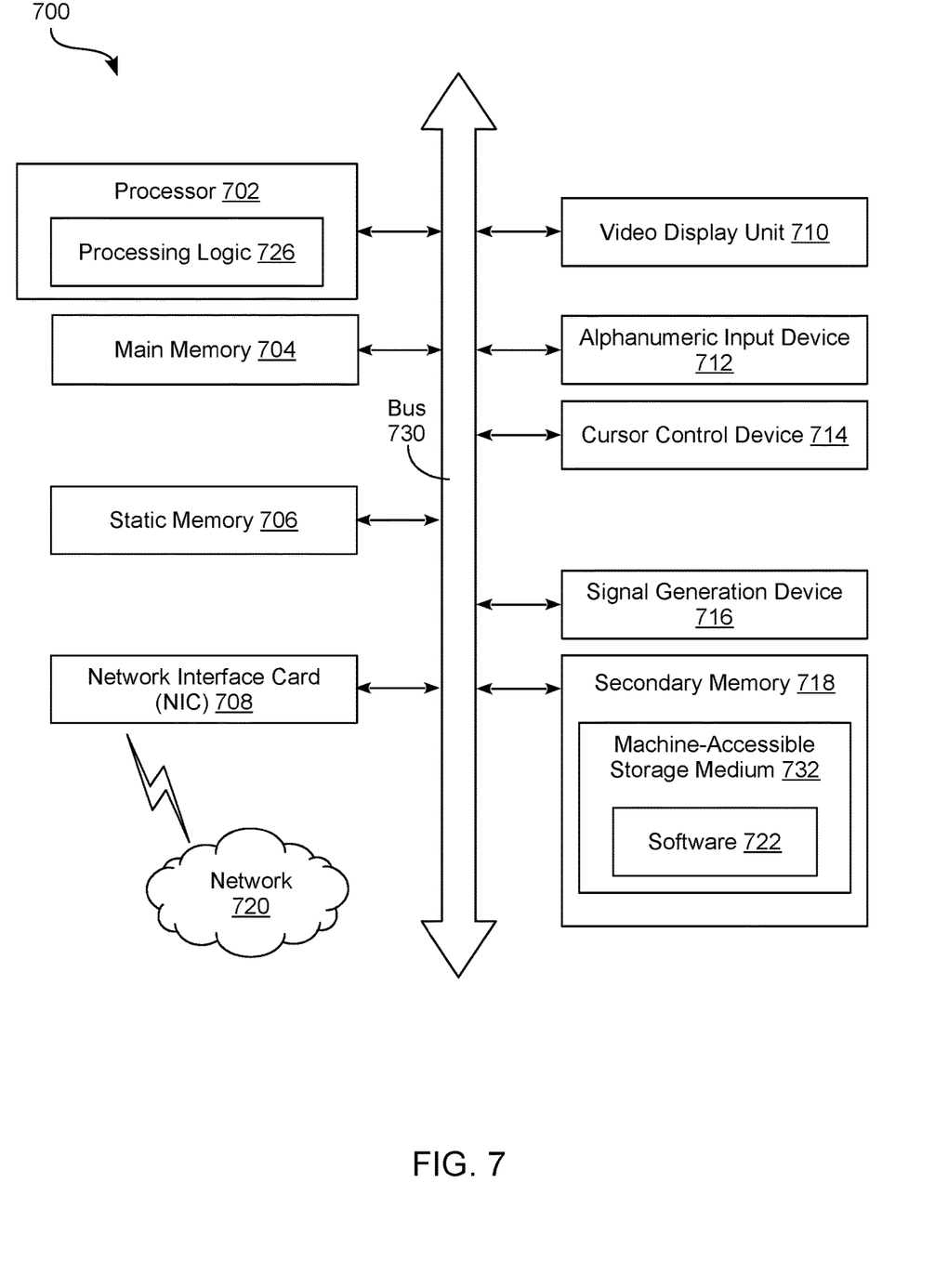
FIG. 7 is a functional block diagram illustrating an exemplary computer system, in accordance with one embodiment.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more embodiments. The term "machine-readable storage medium" shall accordingly be taken to include, but not be limited to, solid-state memories, and optical and magnetic media.

Techniques and architectures for performing a circuit burn-in process are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A packaged device for participating in a burn-in process, the packaged device comprising:
   a first conductive contact and a second conductive contact each to couple the packaged device to a test unit, wherein the first conductive contact and the second conductive contact are to receive, respectively, a supply current and a supply voltage from the test unit during a burn-in process;
   a voltage regulator (VR) circuit, wherein a leg between a first node and a second node comprises an active circuit element of the VR circuit, wherein, during the burn-in process, the VR circuit is to receive the supply voltage via the second node and, based on the supply voltage, to provide a regulated output voltage to the load circuit via the first node, wherein the VR circuit to provide the regulated output voltage comprises the active circuit component to change a conductivity of the leg, wherein the VR circuit is to provide the regulated output voltage to the load circuit while the load circuit receives the supply current from the first conductive contact via a path which is independent of any leg which is between the first node and the second node.

2. The packaged device of claim 1, wherein an integrated circuit (IC) chip of the packaged device comprises the load circuit, and wherein the leg further comprises a coil structure which is distinct from, and electrically coupled to, the IC chip.

3. The packaged device of claim 2, wherein the IC chip further comprises switch circuitry of the VR and control circuitry to operate the switch circuitry.

4. The packaged device of claim 2, wherein the first conductive contact is electrically coupled to the load circuit independent of any coil structure of the VR circuit which is external to the IC chip.

5. The packaged device of claim 1, wherein the load circuit is to receive the supply current from the first conductive contact via the first node.

6. The packaged device of claim 1, wherein a grid array comprises the first conductive contact and the second conductive contact.

7. The packaged device of claim 1, wherein a grid array comprises the second conductive contact, wherein the first conductive contact is a conductive contact other than any conductive contact of the grid array.

8. The packaged device of claim 7, wherein the grid array and the first conductive contact are each at a first side of the packaged device.

9. The packaged device of claim 7, wherein the grid array is at a first side of the packaged device, and wherein the first conductive contact is at a second side of the packaged device.

10. A packaged device for participating in a burn-in process, the packaged device comprising:
    a coil structure;
    an integrated circuit (IC) chip electrically coupled to the coil structure, the IC chip comprising a node, wherein a voltage regulator comprising the coil structure is coupled to a load circuit via the node; and
    a first conductive contact and a second conductive contact, the first conductive contact electrically coupled to the node independent of any coil structure of the voltage regulator which is external to the IC chip, the second conductive contact electrically coupled to the load circuit via the coil structure;
    wherein the voltage regulator is to provide a first voltage to the load circuit based on a second voltage at the second conductive contact concurrent with a supply current at the first conductive contact.

11. The packaged device of claim 10, wherein the coil structure is a first coil structure, and wherein a first buck converter of the voltage regulator comprises the first coil structure, the packaged device further comprising:
    a second coil structure electrically coupled to the IC chip, wherein a second buck converter of the voltage regulator comprises the second coil structure, and wherein the first buck converter and the second buck converter each couple the second conductive contact to the load circuit.

12. The packaged device of claim 10, wherein the load circuit is a first load circuit, wherein the voltage regulator is a first voltage regulator, wherein the coil structure is a first coil structure, and wherein the supply current is a first supply current, the packaged device further comprising:
    a second load circuit of the IC chip;
    a second voltage regulator comprising a second coil structure electrically coupled to the IC chip, wherein the second voltage regulator is coupled to the second load circuit via a second node;
    a third conductive contact electrically coupled to the second node independent of any coil structure of the second voltage regulator which is external to the IC chip; and
    wherein the second conductive contact is coupled to the second load circuit via the second coil structure; and
    wherein the second voltage regulator is to provide a third voltage to the second load circuit based on:
      the second voltage at the second conductive contact; and
      a second supply current at the third conductive contact.

13. The packaged device of claim 10, wherein IC chip further comprises the load circuit.

14. The packaged device of claim 10, wherein a grid array comprises the first conductive contact and the second conductive contact.

15. The packaged device of claim 10, wherein a grid array comprises the second conductive contact, wherein the first conductive contact is a conductive contact other than any conductive contact of the grid array.

16. The packaged device of claim 15, wherein the grid array and the first conductive contact are each at a first side of the packaged device.

17. The packaged device of claim 15, wherein the grid array is at a first side of the packaged device, and wherein the first conductive contact is at a second side of the packaged device.

18. An apparatus for participating in a burn-in process, the apparatus comprising:
  a hardware interface to couple the apparatus to a packaged device under test (DUT) which comprises an inductor and an integrated circuit (IC) chip electrically coupled to the inductor, wherein the IC chip comprises switch circuitry and a load circuit, wherein a voltage regulator of the DUT comprises the inductor and the switch circuitry, the voltage regulator coupled to the load circuit via a node, and wherein the hardware interface comprises:
    a first conductive contact to electrically couple to the node via a first path which is independent of any inductor of the voltage regulator which is external to the IC chip; and
    a second conductive contact to electrically couple to the node via a second path which comprises the inductor;
  a first circuit and a second circuit coupled, respectively, to the first conductive contact and to the second conductive contact;
  a third circuit to control a burn-in of the DUT, comprising the third circuit:
    to signal the first circuit to provide a supply current to the node via the first conductive contact; and
    to signal the second circuit to provide a voltage to the voltage regulator via the second conductive contact, wherein the second circuit to provide the voltage concurrent with the supply current at the first conductive contact.

19. The apparatus of claim 18, wherein the third circuit to control the burn-in of the DUT according to a predefined schedule which specifies one or more conditions to change a characteristic of the supply current or a characteristic of the voltage.

20. The apparatus of claim 19, further comprising circuitry to collect performance data from the DUT and to evaluate, based on the performance data, whether the load circuit satisfies one or more test criteria.

* * * * *